US010712659B2

(12) United States Patent
Gallagher et al.

(10) Patent No.: US 10,712,659 B2
(45) Date of Patent: Jul. 14, 2020

(54) METHOD FOR FORMING A CARBON NANOTUBE PELLICLE MEMBRANE

(71) Applicants: IMEC VZW, Leuven (BE); Imec USA Nanoelectronics Design Center, Kissimmee, FL (US)

(72) Inventors: Emily Gallagher, Burlington, VT (US); Cedric Huyghebaert, Heverlee (BE); Ivan Pollentier, Langdorp (BE); Hanns Christoph Adelmann, Wilsele (BE); Marina Timmermans, Bertem (BE); Jae Uk Lee, Heverlee (BE)

(73) Assignees: IMEC VZW, Leuven (BE); Imec USA Nanoelectronics Design Center, Kissimmee, FL (US)

( * ) Notice: Subject to any disclaimer, the term of this patent is extended or adjusted under 35 U.S.C. 154(b) by 249 days.

(21) Appl. No.: 15/979,800

(22) Filed: May 15, 2018

(65) Prior Publication Data
US 2018/0329289 A1 Nov. 15, 2018

(30) Foreign Application Priority Data
May 15, 2017 (EP) .................................. 17171172

(51) Int. Cl.
*G03F 1/22* (2012.01)
*G03F 1/62* (2012.01)
(Continued)

(52) U.S. Cl.
CPC .............. *G03F 1/64* (2013.01); *C01B 32/159* (2017.08); *G03F 1/22* (2013.01); *G03F 1/62* (2013.01); *B82Y 30/00* (2013.01); *B82Y 40/00* (2013.01)

(58) Field of Classification Search
CPC . C01B 32/159; G03F 1/22; G03F 1/64; G03F 1/62; B82Y 30/00
See application file for complete search history.

(56) References Cited

U.S. PATENT DOCUMENTS

| 2005/0202684 A1* | 9/2005 | Min | B82Y 30/00 438/778 |
| 2008/0152873 A1* | 6/2008 | Okoroanyanwu | B82Y 10/00 428/195.1 |

(Continued)

FOREIGN PATENT DOCUMENTS

| EP | 3118683 A1 | 1/2017 |
| WO | 2005/085130 A2 | 9/2005 |

OTHER PUBLICATIONS

Tsai et al. "Conductivity enhancement of multiwalled carbon nanotube thin film via thermal compression method" Nanosc. Res. Lett., vol. 9 pp. 451 (6 pages) (2014).*

(Continued)

*Primary Examiner* — Martin J Angebranndt
(74) *Attorney, Agent, or Firm* — McDonnell Boehnen Hulbert & Berghoff LLP (57) ABSTRACT

The present disclosure relates to a method for forming a carbon nanotube pellicle membrane for an extreme ultraviolet lithography reticle, the method comprising: bonding together overlapping carbon nanotubes of at least one carbon nanotube film by pressing the at least one carbon nanotube film between a first pressing surface and a second pressing surface, thereby forming a free-standing carbon nanotube pellicle membrane. The present disclosure also relates to a method for forming a pellicle for extreme ultraviolet lithography and for forming a reticle system for extreme ultraviolet lithography respectively.

20 Claims, 4 Drawing Sheets (51) Int. Cl.
*G03F 1/64* (2012.01)
*C01B 32/159* (2017.01)
*B82Y 30/00* (2011.01)
*B82Y 40/00* (2011.01)

(56) References Cited

U.S. PATENT DOCUMENTS

| | | | |
|---|---|---|---|
| 2012/0298289 | A1 | 11/2012 | Jiang et al. |
| 2015/0309405 | A1 | 10/2015 | Shih et al. |
| 2016/0083872 | A1 | 3/2016 | Zhang et al. |
| 2016/0161857 | A1 | 6/2016 | Levinson et al. |
| 2017/0038676 | A1 | 2/2017 | Jung et al. |
| 2017/0082920 | A1 | 3/2017 | Tseng et al. |
| 2018/0329291 | A1* | 11/2018 | Timmermans ............ G03F 1/62 |
| 2019/0129300 | A1* | 5/2019 | Ono ...................... C01B 32/159 |

OTHER PUBLICATIONS

Zhang et al., "Strong, transparent multifunctional, carbon nanotube sheets", Science vol. 309 (5738) pp. 1215-1219 (Aug. 2005).*
Zhao et al., "Electrical transport properties of multilayered single-walled carbon nanotube films", J. Nanotechnol., vol. 2012, Articles ID 601582, 5 pages (2012).*
Zhu et al., "Assembly and applications of carbon nanotube thin films", J. Mater. Sci. Technol., vol. 24(4) pp. 447-456 (2008).*
Pollentier et al., "EUV imaging using novel pellicle membranes", Proc. SPIE vol. 9776 article 977620 (14 pages) (Mar. 18, 2016).*
Lin et al. "In-situ welding carbon nanotubes into a porous solid with super-high compressive strength and fatigue resistance", Scientific Reports 5 article 11336 10 pages (Jun. 2015).*
Hashim et al., "Covalently bonded three-dimensional carbon nanotube solids via boron induced nanojunctions", Scientific Reports, vol. 2, article 363, 8 pages (Apr. 2012).*
Liu et al., "Highly aligned dense carbon nanotube sheets induced by multiple stretching and pressing", Nanoscale vol. 6 pp. 4338-4344 (2014).*
Wu et al., "Transparent, conductive carbon nanotube films", Science vol. 305 (5688) pp. 1273-1276 (Aug. 2004).*
Xu et al., "High-strength carbon nanotube film from improving alignment and densification", Nanolett. vol. 16 pp. 946-952 (Jan. 2016).*
Nasibulin et al. "Multifunctional free-standing single walled carbon nanotube films", ACS Nano vol. 5(4) pp. 3214-3221 (Mar. 2011).*
Kaskela et al., "Aerosol-synthesized SWCNT networks with tunable conductivity and transparency by a dry transfer technique", Nano Lett., vol. 10 pp. 4349-4355 (2010).*
Vanpaennel et al., "Alternative membrane development at imec", 20 pages (Feb. 2016).*
European Search Report, European Patent Application No. 17171172.4, dated Nov. 6, 2017, 5 pages.

* cited by examiner

METHOD FOR FORMING A CARBON NANOTUBE PELLICLE MEMBRANE

CROSS-REFERENCE TO RELATED APPLICATIONS

The present application is a non-provisional patent application claiming priority to European Patent Application No. 17171172.4, filed May 15, 2017, the contents of which are hereby incorporated by reference.

FIELD OF THE DISCLOSURE

The present disclosure relates to a method for forming a carbon nanotube pellicle membrane for an extreme ultraviolet lithography reticle, to a method for forming a pellicle for extreme ultraviolet lithography and to a method for forming a reticle system for extreme ultraviolet lithography.

BACKGROUND

In semiconductor fabrication, various lithographic processes are extensively used in the course of defining devices and circuit patterns. Depending on the size of the features to be defined, different optical lithographic processes may be used. In general, as the patterns become smaller, shorter wavelengths are utilized. In extreme ultraviolet lithography ("EUVL") a wavelength of about 13.5 nm is frequently used. In EUVL, a pattern present on a photomask or reticle may be transferred to a layer sensitive to extreme ultraviolet ("EUV") radiation by illuminating the reticle with EUV radiation. The EUV light is modulated by the reticle pattern and imaged onto a photoresist-coated wafer.

In conventional lithography, a pellicle is commonly placed above the reticle to protect the reticle from contamination during handling and exposure etcetera. The pellicle will thus protect the reticle from unwanted particles which otherwise could negatively impact the fidelity of the pattern transfer to the wafer. As the pellicle remains above the reticle during exposure, there are stringent requirements on the pellicle in terms of absorption, durability, and particle shielding capabilities, etc.

When it comes to EUVL it has been challenging to find suitable pellicle candidates. Conventional deep ultraviolet ("DUV") pellicles typically provide excessive absorption of extreme ultraviolet light even for very thin material thicknesses. Further, the high energy of the extreme ultraviolet light combined with the scanner environment is prone to damaging the material of the pellicle membrane. Thus, it has proved troublesome to identify pellicle designs that are compatible with EUVL.

SUMMARY

In view of the above, a general objective of the present disclosure is to provide a pellicle membrane for an extreme ultraviolet lithography reticle, which enables a pellicle suitable for use in EUVL. Further objectives may be understood from the following:

According to a first aspect of the present disclosure, this and other objects are achieved by a method for forming a carbon nanotube pellicle membrane for an extreme ultraviolet lithography reticle, the method comprising: bonding together overlapping carbon nanotubes of at least one carbon nanotube film by pressing the at least one carbon nanotube film between a first pressing surface and a second pressing surface, thereby forming a free-standing carbon nanotube pellicle membrane.

By the disclosed method, a carbon nanotube ("CNT") pellicle membrane, or shorter CNT pellicle membrane, for an extreme ultraviolet lithography reticle may be formed by pressing at least one carbon nanotube film between a first pressing surface and a second pressing surface. The at least one carbon nanotube film may thus be pressed between the pressing surfaces such that overlapping or crossing CNTs of the at least one CNT film are bonded together. A free-standing CNT pellicle membrane may thereby be formed.

The free-standing CNT pellicle membrane formed according to the present disclosure allows for a mechanically stable membrane having a low absorption of EUV radiation or EUV light. EUV light may have a wavelength in the range of 1 nm to 40 nm.

It should be noted that within the context of this application the term "CNT film" may refer to any connected arrangement of CNTs, such as a mesh, a web, a grid or similar arrangement formed of individual CNTs or bundles of CNTs. Individual CNTs (which may be single walled CNTs or multi walled CNTs, MWCNTs) of each CNT film may be aligned to form bundles. Such bundles of aligned CNTs tend to form spontaneously during manufacture of CNT films. Accordingly, bonding together overlapping carbon nanotubes may include bonding together overlapping individual CNTs or overlapping CNT bundles.

The CNTs or CNT bundles of the CNT film may be randomly arranged within the CNT film. The CNTs or CNT bundles of the CNT film may however be arranged or aligned along a predominant or major direction or along a plurality of major directions.

It should be noted that within the context of this application the term "free-standing CNT pellicle membrane" may refer to any CNT membrane being free-standing or self-supporting in the sense that it is capable of supporting its own weight when being suspended at edges thereof, for instance by a frame, such as a pellicle frame. In other words, the free-standing CNT pellicle membrane is capable of supporting its own weight when having a size being relevant for use in EUV pellicles, without appreciable sagging.

The pellicle membrane so formed may thus suitably be used in a EUV pellicle. The membrane formed by pressing the at least one CNT film between the pressing surfaces will become significantly stronger than the CNT film or films used for forming the membrane. The enhanced strength results from the bonding of the overlapping CNTs of the CNT film or films.

In an example embodiment, the at least one CNT film is (even prior to the pressing of the method) a free-standing or self-supporting CNT film, i.e., a film capable of supporting its own weight when being suspended by e.g., a frame, such as a pellicle frame.

The CNTs of the CNT film may be single walled CNTs, ("SWCNTs"). Accordingly, each of the at least one CNT film may be formed by SWCNTs or bundles of SWCNTs. A SWCNT may be described as a cylindrical or tubular molecule of a single graphene sheet. The at least one CNT film may be formed of SWCNTs with a diameter in the range of 0.5-2 nm. SWCNTs may typically present a low absorption of EUV radiation.

The CNTs of the CNT film may also be multi walled CNTs ("MWCNTs"). Accordingly, each of the at least one CNT film may be formed by MWCNTs or bundles of MWCNTs. MWCNTs may be described as two or more concentric cylinders of tubes of SWCNTs or graphene sheets. The at least one CNT film may be formed by MWCNTs with diameters in the range of 5-30 nm.

It should be noted that within the context of this application the term "bonding together" may refer to any type of interaction resulting in any type of attractive force between overlapping CNTs which is greater than an attractive force resulting from merely positioning CNTs on top of each other. The resulting attractive force here refers to the force which remains after the pressure from the pressing surfaces has been removed.

As may be further described in the following, the bonding may be the result of direct chemical bonds between overlapping CNTs, or of bonds between coatings, species, molecules, or similar present on the surface of the overlapping CNTs. In other words, the bonding may be direct between carbon atoms of respective overlapping CNTs or may be indirect between e.g. coatings present on and fixed to the surface of the overlapping CNTs.

The bonds may form between overlapping CNTs of a same film. Alternatively or additionally, the bonds may form between overlapping CNTs of different films. This means that when more than one CNT film is pressed in accordance with the present disclosure, the films will bond to each other by the bonding taking place during the pressing. In other words, the films will become fixed to each other thereby forming the free-standing CNT pellicle membrane.

It should be noted that within the context of this application the term "pressing" may refer to the application of any type of mechanical pressure. In other words, any mechanical pressure that may be applied to the at least one CNT film may be intended. In an example embodiment, a pressure of at least 0.1 kPa is applied to the at least one CNT film.

It should be noted that within the context of this application the term "pressing surface" may refer to any type of surface which may be used to apply a mechanical pressure to the at least one CNT film. For this reason, the first and/or the second pressing surface may be actuated or moved so as to apply a mechanical pressure. In general, one of the pressing surfaces is typically moved and pressed against the other pressing surface.

Accordingly, the present disclosure enables a method of forming a free-standing CNT pellicle membrane where the so formed free-standing CNT pellicle membrane exhibits a relatively high mechanical strength and low EUV light absorption. Also particle blocking or protection properties and chemical resistance of the CNT pellicle membrane so formed may be enhanced by the bonding between the overlapping CNTs.

According to an embodiment, at least two CNT films may be pressed between the first pressing surface and the second pressing surface, which may be beneficial in that a mechanically strong free-standing CNT pellicle membrane with a reduced pore size may be formed.

The at least two CNT films may be arranged on top of each other (in a stacked fashion) and thereafter bonded together by being pressed between the pressing surfaces. By this arrangement, the at least two CNT films may bond to each other during the pressing so as to form the free-standing CNT pellicle membrane. The CNT pellicle membrane may for example include 2, 3, or 4 CNT films just to give a few non-limiting examples. Any number of CNT films may be used.

According to an embodiment, the method may further comprise forming a coating on the at least one CNT film prior to pressing the at least one CNT film. By forming a coating on the at least one CNT film prior to pressing the at least one CNT film, the bonding together of the overlapping CNTs may be facilitated. By forming a coating on the at least one CNT film, the bonding may take place between elements of the coating at locations where the CNTs overlap. A coating may moreover reduce an amount of residual stress of the CNT membrane.

The coating that may be formed on the at least one CNT film may be formed such that the coating is formed on individual CNTs or on individual CNT bundles of the at least one CNT film. The coating may be a conformal coating. In an example embodiment, the coating is formed on the surface of the CNTs such that the CNTs or CNT bundles are partially enclosed or completely enclosed by the coating.

The coating may as an alternative be formed on at least a surface portion of the at least one CNT film. In this case a coating with a thickness in the range of 1 to 30 nm may be formed on at least a surface portion of the at least one CNT film.

In an example embodiment, the forming of the coating may include forming a coating of a material selected from the group consisting of: B, $B_4C$, ZrN, Mo, Ru, SiC, TiN, and a-C, or of a combination of two or more materials of the group. The coating may for instance be formed by a stack of layers of materials selected from the afore-mentioned group. By forming a coating the bonding together of overlapping CNTs may be facilitated. Further, the coating may protect the CNTs of the membrane from the potentially adverse process environments during EUVL, for instance during hydrogen plasma cleaning processes. Moreover, by forming a coating the free-standing CNT pellicle membrane being formed may exhibit a low absorption of extreme ultraviolet light, rendering the membrane suitable for EUV applications.

According to one embodiment, the pressing may include applying a pressure of 0.1 kPa to 30 MPa, which may be beneficial in that overlapping CNTs may be bonded together. The bonding may take place under vacuum conditions. By applying a sufficiently low vacuum pressure, cold welding of the coating at locations where the CNTs overlap may occur, thereby forming a strong bonding between overlapping CNTs.

According to one embodiment, overlapping CNTs of the at least one CNT film may be in direct contact at locations where the CNTs overlap or cross. A "CNT-only" membrane may hence be formed. In other words, the bonding may take place between overlapping un-coated CNTs. The bonding may take place between CNTs within the same CNT film or between CNTs of different CNT films. The bonding may take place between CNTs of different CNT bundles (of a same or different CNT films).

According to one embodiment, the pressing may include applying a pressure of 10-30 GPa. By applying a pressure in this range bonding may take place between overlapping un-coated CNTs.

According to one embodiment, the first pressing surface and the second pressing surface may be flat or smooth surfaces, which may be beneficial in that the pressing surfaces may apply a pressure uniformly to the at least one CNT film. In practice, an increased pressure may however form at positions where the CNTs overlap since a density of the film or film stack may be greater at the positions of overlap.

According to one embodiment, the first pressing surface and/or the second pressing surface may be provided with a protruding pattern, which may be beneficial in that the pressure may be increased or concentrated at locations of the protruding pattern. The pressure may thus be increased locally at locations corresponding to the protruding pattern. The use of a protruding pattern may additionally reduce the surface area of the pressing surface or surfaces contacting the at least one CNT film, thereby reducing the risk of the at least one CNT film sticking to the pressing surface or surfaces.

According to one embodiment, the protruding pattern may comprise a pattern having a pitch smaller than an average length of the CNTs or CNT bundles of the at least one CNT film, which may be beneficial in that a sufficient number of bonds may be formed so as to form a mechanically stable free-standing CNT pellicle membrane.

It should be noted that within the context of this application "pitch" of a pattern may refer to a smallest distance between consecutive protrusions of the pattern. The distance may be a distance along a surface direction of the pressing surface having the protruding pattern. The pitch of the protruding pattern may for example be in the range of 200 nm to 200 µm. The pitch of the protruding pattern may be adapted in accordance with different average lengths of the CNTs of the at least one CNT film. The CNTs may be bundled where the length of a bundle typically is significantly greater than the length of individual CNTs.

According to an embodiment, the protruding pattern may, for example, be formed by a rough surface, a set of protruding pins, a line pattern, a square grid, or a hexagonal grid. Such patterns may be used for achieving positions with locally increased pressure. The protruding pattern may be a regular pattern or an irregular pattern.

According to one embodiment, the first pressing surface and/or the second pressing surface may be provided with an anti-sticking coating, which may be beneficial in that risk of the at least one CNT film sticking to the pressing surface or surfaces may be reduced.

The anti-sticking coating may typically be a coating reducing the surface energy of the pressing surface or surfaces. Fluorinated alkyl derivatives or fluorinated polymers such as polytetrafluoreten, PTFE, fluorinated ethylene propylene, or perfluoroalkoxy may be used. Moreover, a graphene coating, a self-assembled monolayer comprising thiol, or a self-assembled thiol monolayer comprising alkyl end-groups may be used for the anti-sticking coating.

According to one embodiment, the method may further comprise heating the at least one CNT film while pressing, which may be beneficial in that the bonding may be facilitated. The at least one CNT film may for example be heated to a temperature within the range from above room temperature (e.g. 20° C.) to 500° C. while applying the pressure. In an example embodiment, the at least one CNT film may be heated to a temperature below 300° C. while applying the pressure.

According to one embodiment, the method may further comprise forming a coating on the CNTs forming the membrane, subsequent to the pressing, wherein forming the coating includes forming a coating including a material selected from the group consisting of: B, $B_4C$, ZrN, Mo, Ru, TiN, SiC, a-C, and graphene. By forming a coating on the CNT pellicle membrane, the properties of the CNT pellicle membrane may be tailored. Further, attachment of the CNT pellicle membrane to a pellicle frame may be facilitated, as will be described further below.

According to one embodiment, the method may further comprise forming a graphene flake coating layer by depositing graphene flakes on a main surface of the CNT pellicle membrane.

By forming a graphene flake coating layer on a main surface of the CNT pellicle membrane, the membrane may be made stronger and the pore size of the membrane may be reduced. A reduced pore size may improve the particle blocking properties of the membrane.

It should be noted that within the context of this application the term "graphene flake" may refer to any flake of graphene. In other words, any flake of a carbon allotrope of hexagonal 2D lattice of carbon atoms may be intended.

Attractive forces will typically occur between adjacent graphene flakes as well as between graphene flakes and CNTs of the CNT membrane. The attractive forces may consequently strengthen the CNT membrane. The graphene flakes of the graphene flake coating layer may be bonded to the self-supporting CNT pellicle membrane by Van der Waals forces. Adjacent graphene flakes of the coating layer may be bonded to each other by Van der Waals forces.

According to one embodiment, the graphene flakes may have a surface area exceeding a pore size of the CNT pellicle membrane, which may be beneficial in that the graphene flakes may be arranged on the CNT pellicle membrane while being supported by the CNTs of the CNT pellicle membrane. Moreover, graphene flakes having a surface area exceeding a pore size of the CNT pellicle membrane may result in a reduced risk of the graphene flakes falling off from the CNT pellicle membrane.

It should be noted that within the context of this application the term "pore size" may refer to any size of any opening in the CNT pellicle membrane. In other words, the cross sectional area of any opening between CNTs of the CNT pellicle membrane may be intended. A pore may be defined by a plurality of CNTs forming an opening or void, oriented in the plane of extension of the CNT pellicle membrane.

According to one embodiment, a lateral dimension of the graphene flakes along a main surface thereof may be between 75 nm and 50 µm, which may be beneficial in that a uniform graphene flake coating layer may be formed on the CNT pellicle membrane, thereby increasing the surface area of the CNT pellicle membrane.

According to one embodiment, the forming of the graphene flake coating layer may include arranging the graphene flakes to overlap adjacent graphene flakes, which may be beneficial in that the particle blocking of the CNT pellicle membrane may be further increased. In addition, the CNT pellicle membrane may become stronger owing from attractive forces between overlapping adjacent graphene flakes.

According to one embodiment, the forming of the graphene flake coating layer may include applying a solution comprising the graphene flakes to the CNT pellicle membrane, and evaporating a solvent of the solution. This provides a convenient and rational manner of applying a graphene flake coating layer.

In an example embodiment, the solvent may include an alcohol. By applying a suspension comprising alcohol and the graphene flakes to the to the CNT pellicle membrane the CNT pellicle membrane may become densified while forming the graphene flake coating layer. By forming of the graphene flake coating while densifying the CNT pellicle membrane, the properties of the membrane may be increased when the coating is formed.

According to one embodiment, the forming of the graphene flake coating layer may further include heating the CNT pellicle membrane, which may be beneficial in that the properties of the graphene flake coating layer may be enhanced while the CNT pellicle membrane may be made stronger.

As an example, the CNT pellicle membrane may be heated up to a temperature of 1500° C. In an example embodiment, the nanotube pellicle membrane may be heated up to a temperature of 600° C.

According to one embodiment, the step of forming the graphene flake coating layer may further include applying a pressure to the CNT pellicle membrane and the graphene flakes, which may be beneficial in that the properties of the graphene flake coating layer may be further improved. By applying a pressure, the graphene flakes may form a more uniform graphene flake coating layer while being bonded to the CNTs of the CNT pellicle membrane.

As an example, a pressure of 0.1 kPa to 30 MPa may be applied to the CNT pellicle membrane and the graphene flakes when the CNTs of the CNT pellicle membrane are coated as disclosed above. According to another example, a pressure of 10-30 GPa may be applied the CNT pellicle membrane and the graphene flakes when the CNTs of the CNT pellicle membrane are un-coated as disclosed above.

According to a second aspect of the present disclosure a method for forming a pellicle for extreme ultraviolet lithography is provided. The method comprises: forming a CNT pellicle membrane in accordance with what has been disclosed above, and fixing the CNT pellicle membrane to a pellicle frame. By fixing a CNT pellicle membrane of the above disclosed kind to a pellicle frame, a pellicle for extreme ultraviolet lithography may be formed. The pellicle so formed may thus be used to protect a reticle for extreme ultraviolet lithography from particles etcetera.

According to one embodiment, a coating is formed on the CNT pellicle membrane and the act of fixing may comprise: arranging the CNT membrane on a support surface of the pellicle frame, and bonding together the coating of the CNT pellicle membrane and the pellicle support surface by pressing the CNT pellicle membrane and the pellicle support surface against each other thereby fixing the CNT pellicle membrane to the support surface. By pressing the CNT pellicle membrane and the pellicle support surface against each other bonding between the coating and the support surface may take place, thereby fixing the CNT pellicle membrane the pellicle frame. By the present method, the CNT pellicle membrane may be fixed to the pellicle frame in a manner which is relatively gentle to the CNT pellicle membrane.

In an example embodiment, a pressure of 0.1 kPa to 30 MPa may be applied to the CNT pellicle membrane and the support surface of the pellicle frame. It is to be noted that the coating being formed on the CNT pellicle membrane may be formed prior or subsequent to the pressing of the at least one CNT film. The coating may thus be a coating formed on the CNTs of the at least one CNT film prior to the pressing of the at least one CNT film or a coating formed on the on the CNT pellicle membrane.

According to one embodiment, the support surface may be formed by a first material and the coating may be formed by a second material, the first material may be a metal or a semiconductor, the second material may be a metal or a semiconductor. By having the support surface being formed by a first material and the coating being formed by a second material, the CNT pellicle membrane may be fixed to the pellicle frame by cold welding. A eutectic may be formed during the cold welding. A eutectic may be formed by the first material and the second material at the interface between the materials at a relatively low temperature.

A low ambient pressure and/or an elevated temperature may facilitate the fixing or cold welding of the CNT pellicle membrane to the pellicle frame. A pressure below 1 mbar may be used. Lowering the pressure further enables cold welding at reduced temperatures. In an example embodiment, an ambient pressure in the range of $10^{-10}$ mbar to $10^{-6}$ bar may be used. An ambient pressure in this range enables reliable bonding of the pellicle membrane and the pellicle frame.

Typical material combinations or systems may also be metal-semiconductor systems as they may form eutectics at relatively low temperatures. However, cold welding for metal-metal systems and semiconductor-semiconductor systems may also be employed. Combinations of materials forming eutectics may include: Ru and Ge; Pd and Ge; Ru and Si; Nb and Si.

According to one embodiment, the first material and the second material may be the same materials, which may be beneficial in that the risk of damaging one of the first material and the second material during bonding together may be reduced. In other words, if the same material is used for the first material and the second material processing parameters, such as heat, pressure etcetera may not have to account for differences in material properties.

According to one embodiment, the method may further comprise, heating the CNT pellicle membrane and the pellicle frame while applying the pressure, which may be beneficial in that the bonding may be facilitated. Moreover, heat and pressure may in combination allow the amount of stress of the CNT membrane to be controlled. The CNT pellicle membrane and the pellicle frame may for example be heated to a temperature within the range from 100 to 500° C. while applying the pressure. In case a eutectic is to be formed, the CNT pellicle membrane and the pellicle frame may be heated to a temperature within the range from 600 to 900° C. while applying the pressure. However, keeping the temperature below 600° C. may put less stress on the CNT pellicle membrane and coatings.

According to one embodiment, the act of bonding may include pressing the CNT pellicle membrane and the support surface together by means of a mechanical pressure while applying a vacuum having a pressure below 1 mbar to the CNT pellicle membrane and the pellicle frame, which may be beneficial in that the bonding may be further facilitated and that cold welding may occur. Advantageously, the mechanical pressure may be a pressure of 0.1 kPa to 30 MPa.

According to one embodiment, the method may further comprise increasing a tensile stress in the CNT pellicle membrane. The tensile stress may be increased prior to arranging the CNT pellicle membrane on the pellicle frame. However, it is also be possible to increase the tensile stress subsequent to attaching the CNT pellicle membrane to the pellicle frame. The tensile stress may be increased by subjecting the CNT pellicle membrane to a thermal treatment process. The thermal treatment process may include heating the CNT pellicle membrane to an elevated temperature (i.e., above room temperature). Additionally or alternatively the thermal treatment process may include cooling the CNT pellicle membrane to a reduced temperature (i.e., below room temperature).

The tensile stress may also be increased by mechanical means. Accordingly, according to one embodiment, the method may further comprise stretching the CNT pellicle membrane in a lateral direction prior to arranging the CNT pellicle membrane on the pellicle frame. By stretching the CNT pellicle membrane in a lateral direction prior to arranging the CNT pellicle membrane on the pellicle frame, sagging of the CNT pellicle membrane may be counteracted. In other words, the CNT pellicle membrane may exhibit a reduced sagging if stretched in a lateral direction prior to being arranged on the pellicle frame.

The CNT pellicle membrane may be stretched in a single direction, i.e. along a single lateral or surface direction. The CNT pellicle membrane may be stretched in a plurality of lateral directions, such as in normal directions to its edges or in lateral radial directions of the membrane to give a few examples.

According to one embodiment, the pellicle frame may comprise a frame body of a third material which is different from the second material. By this arrangement, a suitable material for the frame body of the pellicle frame may be selected while not influencing the properties of the support surface of the pellicle frame. It is thus possible to form a frame body of the pellicle frame by a material having desired properties in terms of e.g. mechanical strength, thermal expansion or weight, without negatively affecting the bonding capabilities or properties of the support surface of the pellicle frame.

The pellicle frame may be formed by Si, SiN, $SiO_2$, or quartz. These materials present a thermal expansion compatible with the thermal expansion of the CNT pellicle membrane.

The pellicle frame body may be formed by a plurality of materials in order to achieve desired properties. The pellicle frame body may for example be formed by a stack of material layers arranged on top of each other or by a mixture of different materials.

The support surface of the pellicle frame may be formed as a coating on the pellicle frame body, which may be beneficial in that the properties of the pellicle frame body and the support surface may be tuned essentially independently of each other. Moreover, the same type of pellicle frame body may be provided with different types of support surfaces to suit different needs. In other words, the same type of pellicle frame body may be combined with CNT pellicle membranes of different kinds or CNT pellicle membranes having different coatings.

According to one embodiment, the frame body may be permeable to air, which may be beneficial since the CNT pellicle membrane of the pellicle may be subjected to less mechanical stress when subjected to pressure changes. By a frame body which may be permeable to air, air may migrate through the material of the frame body during e.g. vacuum pumping or pressure increase. This means that the frame body may assist in equilibrating a pressure change taking place on one side of the CNT pellicle membrane of the pellicle.

According to an aspect of the present disclosure a method for forming a reticle system for extreme ultraviolet lithography is disclosed. The method comprising: forming a pellicle in accordance with what has been disclosed above, and mounting the pellicle on a reticle. By mounting a pellicle of the above disclosed kind to a reticle, a reticle system for extreme ultraviolet lithography may be formed. The reticle system so formed may thus be used in extreme ultraviolet lithography, where the pellicle mounted to the reticle protects the reticle from particles by acting as a physical barrier.

BRIEF DESCRIPTION OF THE FIGURES

The above, as well as additional objects and features of the present disclosure, will be better understood through the following illustrative and non-limiting detailed description, with reference to the appended drawings. In the drawings like reference numerals will be used for like elements unless stated otherwise.

As illustrated in the figures, the sizes of features, layers and regions are exaggerated for illustrative purposes and, thus, are provided to illustrate the general structures of embodiments of the present disclosure. Like reference numerals refer to like elements throughout.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

The present disclosure will now be described more fully hereinafter with reference to the accompanying drawings, in which currently example embodiments of the disclosure are shown. This disclosure may, however, be embodied in many different forms and should not be construed as limited to the embodiments set forth herein; rather, these embodiments are provided for thoroughness and completeness, and fully convey the scope of the disclosure to the skilled person.

Figure 1:
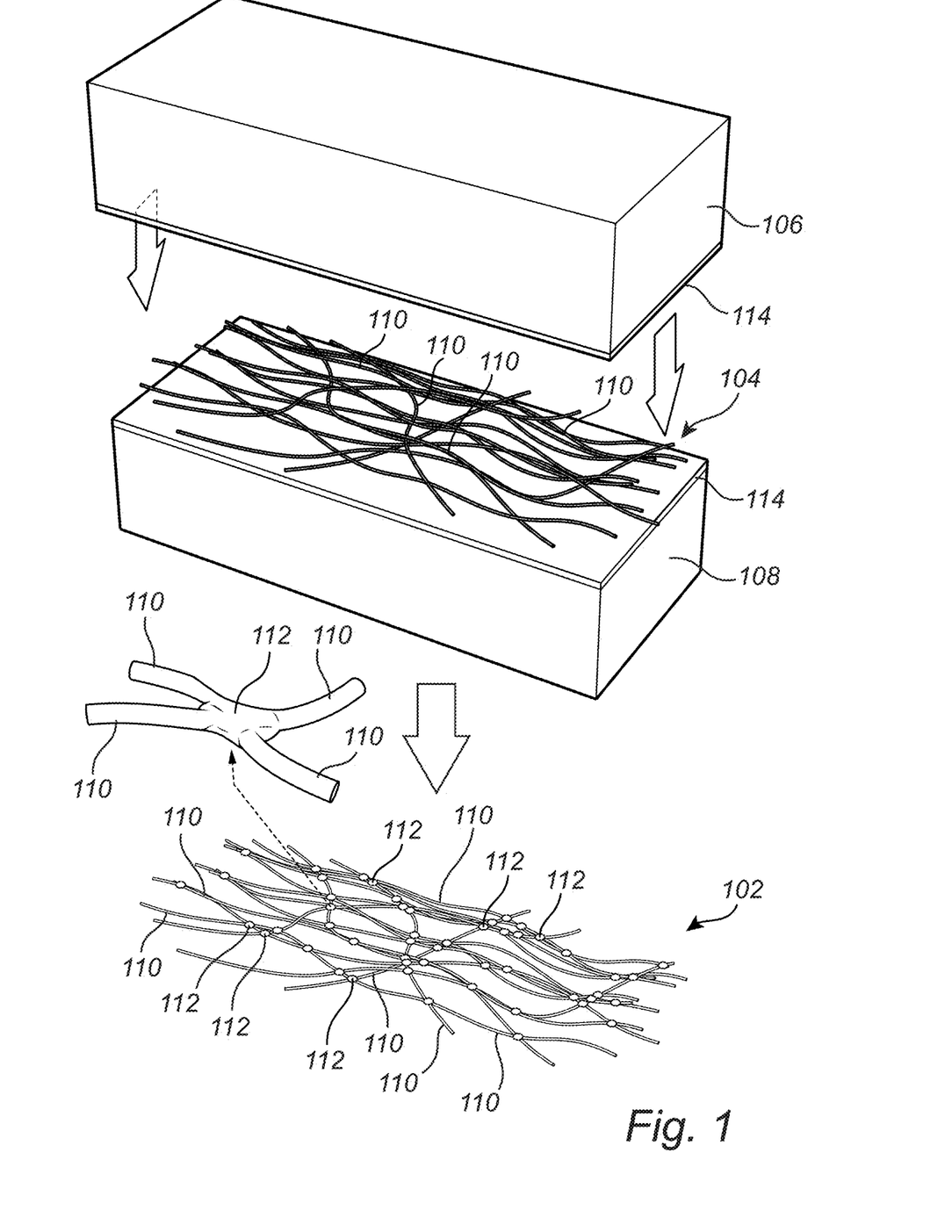
FIG. 1 is a schematic perspective view of a CNT film arranged between pressing surfaces and a CNT pellicle membrane formed by pressing the CNT film, according to an example embodiment.

A method for formation of a CNT pellicle membrane 102 for an extreme ultraviolet lithography reticle will now be described with reference to FIG. 1. In FIG. 1 a CNT film 104 is arranged between a first pressing surface 106 and a second pressing surface 108. The CNT film 104 may be a prefabricated CNT film or may be fabricated in conjunction to being arranged between the pressing surfaces 106, 108. The CNT film 104 of FIG. 1 is a so-called free standing CNT film 104, which means that the CNT film 104 is self-supporting in the sense that it can support its own weight when being suspended from e.g. a pellicle frame or similar. As an alternative, a less strong CNT film not capable of supporting its own weight may be used. In either case, the CNT film 104 may be arranged on a temporary carrier (not shown), for instance in the form of a filter, for instance a cellulose-based or paper filter.

As is schematically depicted in FIG. 1, the individual CNTs 110 of the CNT film 104 are overlapping each other in the sense that the individual CNTs 110 crosses each other within the CNT film 104. In example embodiments, the CNTs 110 of the CNT film 104 may be single walled CNTs, SWCNTs. However, double or multi walled CNTs, DWCNTs or MWCNTs, may be used alternatively.

The individual CNTs of the depicted CNT film 104 are arranged randomly within the CNT film 104 in the sense that the CNTs 110 are not arranged within the CNT film 104 along a major or predominant direction. However, the CNTs of the CNT film 104 may be provided in ordered manner. The CNTs 110 may for example be provided along a major direction or a plurality of major directions.

The CNTs may also be bundled within the CNT film 104 in the sense that a plurality of individual CNTs form a bundle (i.e., a string or rope-like structure), wherein the CNT film is formed of a plurality of bundles forming a web of aligned or randomly oriented CNT bundles. Accordingly, each element 110 shown in FIG. 1 may alternatively refer to a CNT bundle. A CNT bundle 110 may include, for instance, 2-20 individual CNTs. In a CNT bundle 110, individual CNTs may be aligned and joined along their longitudinal directions. CNTs of a bundle may also be joined end-to-end such that the length of the CNT bundle is greater than the length of the individual CNTs. The CNTs may typically be joined by van der Waals forces.

The individual CNTs 110 (or bundles 110) of the CNT film 104 may be coated with a coating, not shown. The coating may be a metal coating of Mo. The coating may at least partially cover the CNTs 110 in the sense that the individual CNTs or the bundles are partially or completely enclosed by the coating, while still forming network of partially free CNTs within the CNT film 104, as depicted in FIG. 1. In an example embodiment, a thickness of the coating on the CNTs 110 may be within the range 1 nm to 30 nm, as this may form a reliable protection of the CNTs of the CNT film 104 from process conditions during use. In other embodiments, a coating thickness in the range of 1 to 10 nm may be used to enable both a reliable protection and a sufficient transmission to EUV radiation. The coating may be formed using any suitable technique as is known in the art, for instance by physical vapor deposition ("PVD"), chemical vapor deposition ("CVD") or atomic layer deposition ("ALD").

Other examples of suitable coatings include B, $B_4C$, ZrN, Ru, SiC, TiN, a-C, and graphene coatings to give a few examples. In other words, coatings of the above material may equally well be used in the above example. For EUV applications, suitable coatings could include coatings which exhibit a limited absorption of extreme ultraviolet light.

As an alternative, a coating may, instead of being formed around the individual CNTs or bundles 110, be formed as a coating layer on one or both main surfaces of the CNT film 104.

In order to bond together overlapping CNTs 110 of the CNT film 104, the CNT film 104 may be pressed between the first and the second pressing surfaces 106, 108. The pressing surfaces 106, 108 may thus be pressed together so as to apply a mechanical pressure to the CNT film 104.

The applied pressure for coated CNTs 110, may be approximately 0.1 kPa or greater. In an example embodiment, the applied pressure may not exceed 30 MPa. Such a pressure is sufficient for bonding to take place between the coatings of the CNTs 110 at locations where the CNTs 110 overlap, such that the CNTs adhere to each other at the overlapping locations. It is to be noted that bonding need not occur at all overlapping locations. The stated pressures may here refer to an average pressure applied over the area of the CNT film 104.

A so-called cold-weld may be formed between the coatings of the CNTs 110 at locations where the CNTs overlap. The bonding taking place at overlapping locations during the pressing is thus enhancing the strength and integrity of the CNT film 104, thereby forming a free-standing CNT pellicle membrane 102. As may be understood, the pressure may increase locally where the CNTs 110 overlap and stack, which facilitates the bonding together of the overlapping CNTs 110. For reasons of clarity the locations 112 at which the bonding has taken place are indicted by dots or bonds 112 in the lower portion of FIG. 1.

More specifically, in the lower portion of FIG. 1, it is depicted how the free-standing CNT pellicle membrane 102 formed by pressing the film 104 may include bonding locations 112 at locations where the CNTs or CNT bundles 110 overlap each other. The bonding locations 112 are as described above illustrated as dots in FIG. 1 for illustrative purposes.

The CNT film 104 may be subjected to a vacuum below 1 mbar during the pressing to facilitate the formation of the bonds 112. In an example embodiment, an ambient pressure in the range of $10^{-10}$ mbar to $10^{-6}$ bar may be used. To further facilitate the formation of the bonds 112, the CNT film 104 may be heated while being pressed between the pressing surfaces 106, 108. The CNT film 104 may for example be heated to a temperature within the range of 20 to 500° C. while applying the pressure. In an example embodiment, the CNT film 104 may be heated to a temperature below 300° C. while applying the pressure.

A CNT pellicle membrane 102 may alternatively be formed by pressing a CNT film 104 of uncoated CNTs or CNT bundles 110, i.e. CNTs having no coating on its external surfaces. In this case, the CNTs 110 of the CNT film 104 will be in direct contact at locations where the CNTs 110 overlap. Also in this case, the CNT film 104 is pressed between the pressing surfaces 106, 108 as described above. When the CNTs 110 of the CNT film 104 are uncoated, a pressure in the range of 10-30 GPa may be applied in order for the bonding to take place between the overlapping CNTs 110 of the CNT film 104. In this case, the bonding will take place directly between the CNTs 110 of the CNT film 104. Direct bonds, for instance co-valent bonds, may form between carbon atoms of overlapping CNTs of the CNT film 104.

Moreover, a plurality of CNT films 104 may be arranged on top of each other in a stacked manner between the first pressing surface 106 and the second pressing surface 108 in which case bonding will take place within each film and also between the plurality of films, thereby forming the free-standing CNT pellicle membrane 102.

The pressing surfaces 106, 108 of FIG. 1 are provided with an anti-sticking coating 114 for reducing the risk of that the CNT film 104 sticks or adheres to the pressing surfaces 106, 108 during the pressing or when being present between the pressing surfaces 106, 108. The anti-sticking coating 114 is provided on and covers the pressing surfaces 106, 108. The depicted anti-sticking coating 114 may be provided in form of a thin polytetrafluoreten, PTFE, coating layer which is formed on the respective pressing surfaces 106, 108. The anti-sticking coating 114 covers the respective pressing surfaces 106, 108. Alternatively, the anti-sticking coating 114 may be formed to cover specific portions of the respective pressing surfaces 106, 108 or may be formed on only one of the respective pressing surfaces 106, 108, i.e., on the first pressing surface 106 or on the second pressing surface 108.

The material of the anti-sticking coating 114 may be varied to suit different needs and to suit different materials and material combinations. Other examples of anti-sticking coatings which are relevant for the present disclosure includes graphene coatings, coatings comprising a self-assembled monolayer ("SAM") comprising thiol and coatings comprising a self-assembled thiol monolayer comprising alkyl end-groups, fluorinated ethylene propylene, and perfluoroalkoxy.

Figure 2:
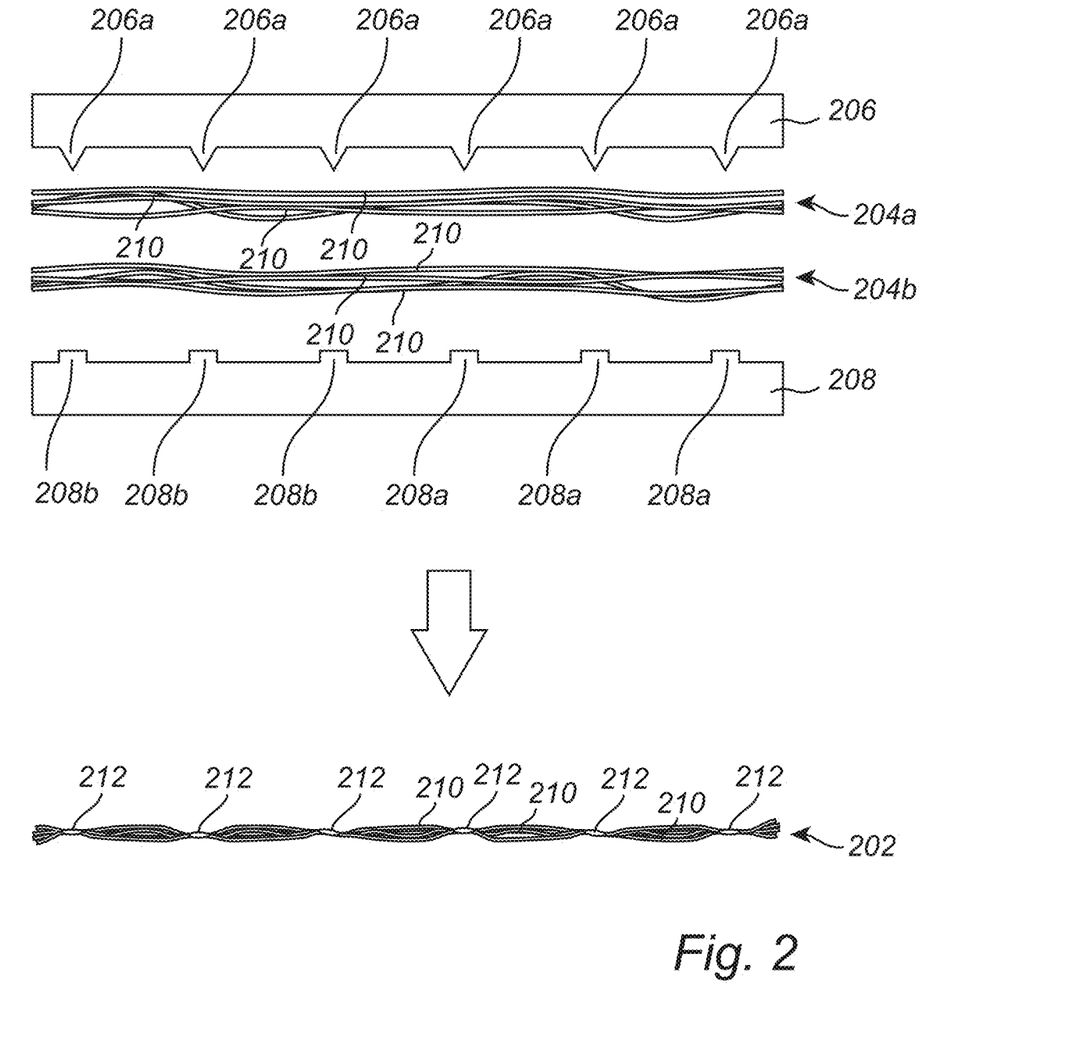
FIG. 2 is a schematic cross sectional view of a two CNT films arranged between pressing surfaces having protruding patterns and a CNT pellicle membrane formed by pressing the CNT films, according to an example embodiment.

Now referring to FIG. 2, here is conceptually depicted how a free-standing CNT pellicle membrane 202 is being formed by pressing a plurality of CNT films 204a, 204b between a first pressing surface 206 and a second pressing surface 208. The formation of the CNT pellicle membrane 202 of FIG. 2 is similar to the formation of the free-standing CNT pellicle membrane 201 of FIG. 1. Hence only relevant differences will be described herein below to avoid undue repetition.

In FIG. 2, two CNT films 204a, 204b are arranged between a first pressing surface 206 and a second pressing surface 208. The two CNT films 204a, 204b are arranged on top of each other in a stacked manner as is depicted in FIG. 2. Equally relevant would be to arrange a single CNT film or further CNT films, such as 3, 4, 5, or 10 CNT films, to give a few examples, between the first pressing surface 206 and the second pressing surface 208 of FIG. 2.

Each of the CNT films 204a, 204b are of the type described above in conjunction with FIG. 1. Like in FIG. 1, individual CNTs 210 (or CNT bundles 210) of the CNT films 204a, 204b are overlapping each other in the sense that the individual CNTs or bundles 210 crosses each other within the CNT films 204a, 204b. In addition, CNTs or bundles 210 of the respective CNT films 204a, 204b are overlapping each other owing from the stacked arrangement of the CNT films 204a, 204b. The CNTs 210 of the CNT films 204a, 204b may be SWCNTs or MWCNTs. Like in FIG. 1, the individual CNTs or bundles 210 of the CNT films 204a, 204b may be provided with a coating, not shown.

The first pressing surface 206 of FIG. 2 is provided with a protruding pattern 206a including a set of pins, where the pins of the pattern 206a are protruding from the first pressing surface 206. A pitch between consecutive pins of the protruding pattern 206a is typically smaller than an average length of the CNTs 210 or bundles of CNTs of the respective CNT films 204a, 204b. In other words, a distance between the pins of the protruding pattern 206a is smaller than an average length of the CNTs 210 or CNT bundles 210 of the respective CNT films 204a, 204b. As an example, the pitch or distance between consecutive pins of the protruding pattern 206a may be in the range of 200 nm to 100 μm. By utilizing a protruding pattern 206a comprising pins, a pressure may be locally applied to the films 204a, 204b at the locations of the pins.

The second pressing surface 208 of FIG. 2 is provided with a protruding pattern 208a including a set of elevated portions or protrusions. The elevated portions of the protruding pattern 208a are arranged in alignment with the pins of the protruding pattern 206a of the first pressing surface 206. This means that the pins of the protruding pattern 206a will contact the elevated portions of the protruding pattern 208a when pressing the pressing surfaces 206, 208 together. A pressure may thus be applied to the CNT films 204a, 204b at the locations of the locations of the pins and elevated portions.

Other patterns than pins and elevated portions may be used on the respective pressing surfaces 206, 208. For instance, line patterns, a square grid, a hexagonal grid, or similar may be used. Moreover, one of the pressing surfaces 206, 208 may be patterned whereas the other may not be. Furthermore, the same type of pattern may be provided on the pressing surfaces 206, 208 or different patterns may be provided. Portions of the pressing surfaces 206, 208 may be patterned whereas other portions may be un-patterned. The protruding pattern 206a, 208a may be a regular pattern or an irregular pattern. The pattern may even be a random pattern, for instance, formed by a rough surface. In example embodiments, the pitch of the patterns/patterns of the respective pressing surfaces 206, 208 are smaller than an average length of the CNTs 210 or of the CNT bundles 210 of the respective CNT films 204a, 204b.

The respective pressing surfaces 206, 208 may be provided with an anti-sticking coating or one of the pressing surfaces 206, 208 may be provided with an anti-sticking coating as described above in conjunction with FIG. 1.

In order to bond together overlapping CNTs 210 within the CNT films 204a, 204b and between the CNT films 204a, 204b, the CNT films 204a, 204b are pressed between the first and the second pressing surfaces 206, 208. The pressing surfaces 206, 208 are thus pressed together so as to apply a mechanical pressure to the CNT films 204a, 204b. The applied pressure for the coated CNTs 210 of FIG. 2, may as described above lie within the range of 0.1 kPa to 30 MPa, as such a pressure is sufficient for bonding to take place between coated CNTs 210 at locations where the CNTs 210 overlap, i.e., within one of the CNT films 204a, 204b or between the CNT films 204a, 204b. It is to be noted that bonding may take place in particular where the protruding patterns 206a, 208a meets and thus applies a pressure to the CNT films 204a, 204b. As described above a cold weld may be formed between the coatings of the CNTs 210 at locations where the CNTs overlap. The bonding taking place during the pressing is thus bonding the CNT films 204a, 204b to each other thereby forming the free-standing CNT pellicle membrane 202. In other words, a single free-standing CNT pellicle membrane 202 may be formed from the CNT films 204a, 204b. The strength and integrity of the CNT pellicle membrane 202 may be increased as compared to the respective CNT films 204a, 204b.

In the lower portion of FIG. 2, it is depicted how the CNT pellicle membrane 202 formed by pressing the films 204a, 204b includes bonding locations 212 at locations where the CNTs or CNT bundles 210 overlap each other. The bonding locations 212 are as described above illustrated as dots in FIG. 2 for illustrative purposes.

The CNT films 204a, 204b may be subjected to a vacuum below 1 mbar during the pressing to facilitate the formation of the bonds 212. To further facilitate the formation of the bonds 212, the CNT films 204a, 204b may be heated while being pressed between the pressing surfaces 206, 208. The CNT films 204a, 204b may for example be heated to a temperature within the range of 20 to 500° C. while applying the pressure. In an example embodiment, the CNT films 204a, 204b may be heated to a temperature below 300° C. while applying the pressure.

A free-standing CNT pellicle membrane 202 may alternatively be formed by pressing a plurality of CNT films 204a, 204b of uncoated CNTs 210 with a pressure in the range of 10-30 GPa in order to form the bonds between the overlapping CNTs 210 of the CNT films 204a, 204b, i.e. within the CNT films 204a, 204b as well as between the CNT films 204a, 204b.

An example embodiment of a free-standing CNT pellicle membrane 102, 202 formed in accordance with a method of the above will now be described. According to this embodiment, the membrane 102, 202 includes or is formed of SWCNTs. The individual CNTs 112, 210 may have a diameter of 0.5-2 nm. Alternatively, the membrane 102, 202 includes or is formed of MWCNTs. The individual CNTs 112, 210 may have a diameter of 5-30 nm. For both SWCNTs and MWCNTs the individual CNTs 112, 210 may have an average length >100 µm. A typical gap between adjacent CNTs 112, 210 may be ≤30±100 nm. The gap may also be referred to as the pore size.

The CNT pellicle membrane 102, 202 may be formed of two to three CNT films 104, 204a, 204b arranged on top of each other in a stacked manner during the pressing. Similar results may be achieved for four or more CNT films 104, 204a, 204b arranged on top of each other in a stacked manner during the pressing.

In an example embodiment, the thickness of the CNT pellicle membrane 102, 202 may be in the range of 5-50 nm. The thickness of the CNT pellicle membrane 102, 202 may be greater depending on the porosity of the CNT pellicle membrane 102, 202. An important parameter of the CNT pellicle membrane 102, 202 is the amount of atoms/cm$^2$, as the atoms will absorb or attenuate the EUV light impinging on the CNT pellicle membrane 102, 202. In other words, the number of atoms/cm$^2$ will influence the transmission efficiency of the CNT pellicle membrane 102, 202. To achieve a transmission of 90% an equivalent thickness of 15 nm graphite or 2.266 g/cm$^3$ may be used in the CNT pellicle membrane 102, 202. These values roughly correspond to $1.7 \cdot 10^{17}$ carbon atoms/cm$^2$ of the pellicle membrane 102, 202. With this insight at hand it is understood that what is important is to form or build a strong CNT membrane 102, 202 with or without coatings which CNT membrane 102, 202 has desired particle retention properties while still having no more than $1.7 \cdot 10^{17}$ carbon atoms/cm$^2$ or a carbon atom density no greater than 2.266 g/cm$^3$.

Membranes having the above characteristics have been subjected to extensive measurements aiming at determining the above characteristics as well as how the membranes works for EUV pellicle applications in practice. The diameter and the average length of the CNTs are mainly set in the course of producing the CNT films 104, 204a, 204b used to form the CNT pellicle membrane 102, 202. Also the gap or pore size is impacted by how densely the CNTs are arranged within the CNT films 104, 204a, 204b used. However, the pore size the CNT pellicle membrane 102, 202 being formed will also be impacted on the number of CNT films 104, 204a, 204b used. A larger number of CNT films 104, 204a, 204b will result in a denser CNT pellicle membrane 102, 202, i.e., a CNT pellicle membrane 102, 202 having a smaller pore size. In general, a denser or less porous CNT pellicle membrane 102, 202 may exhibit better particle retention but may suffer from greater absorption of extreme ultraviolet light. In practice also the diameter and the average length of the CNTs will impact the porosity of the CNT pellicle membrane 102, 202. SEM and TEM may be used to measure the above parameters.

Membranes having the above characteristics have exhibited a high stability to extreme ultraviolet light. A typical transmission loss for a CNT membrane following 100 wafer exposures has been measured to be less than 0.1%. The transmission of extreme ultraviolet light is typically >90% which is a desired value for EUV pellicle applications. Examples of processes for synthesis of SWCNTs and MWCNTs include techniques based on arc-discharge methods, laser ablation, and CVD methods including floating catalyst (aerosol) CVD synthesis. Non-limiting examples of aerosol synthesis techniques is found in WO 2005/085130. An example process for forming aligned CNTs is found in US2016/0083872.

Figure 3:
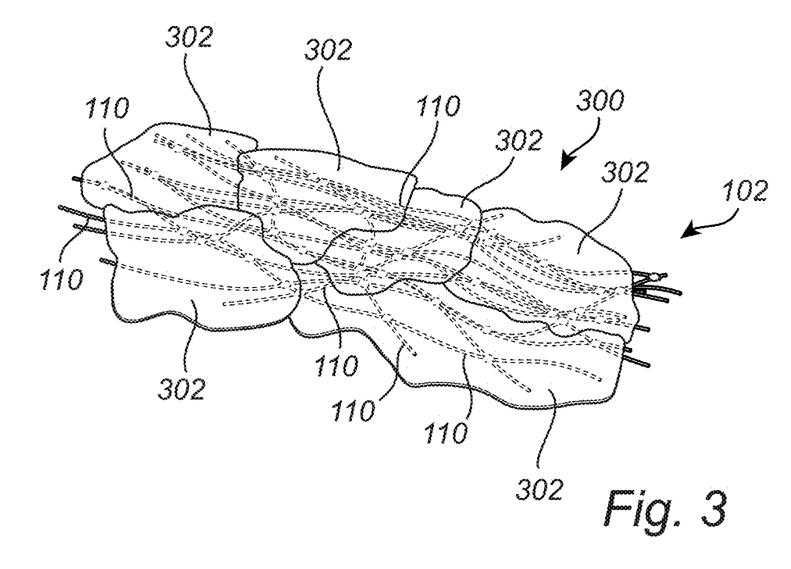
FIG. 3 is a schematic perspective view of the pellicle membrane of FIG. 1 onto which a graphene flake coating layer has been formed, according to an example embodiment.

Now referring to FIG. 3, here is conceptually depicted how a graphene flake coating layer 300 has been formed on a main surface of the CNT pellicle membrane 102 of FIG. 1. The graphene flake coating layer 300 of FIG. 3 is highly simplified for reasons of simplicity. The graphene flake coating layer 300 is formed of a plurality of graphene flakes 302. The graphene flakes 302 are deposited on the nanotube pellicle membrane 102 on a main surface thereof. The graphene flakes 302 are having a surface area exceeding the pore size of the CNT pellicle membrane 102. By this arrangement, the graphene flakes 302 may be arranged on the CNT pellicle membrane 102 while being supported by the CNTs or CNT bundles 110 of the CNT pellicle membrane 102.

As an example, a lateral dimension of the graphene flakes 302 along a main surface thereof may typically be between 75 nm and 50 µm. The larger the graphene flakes 302 become, the greater number of pores are typically covered by an individual graphene flake 302.

In an example embodiment, the graphene flakes 302 may be arranged on the CNT pellicle membrane 102 so as to partially overlap. More specifically, the graphene flakes 302 may be arranged to overlap adjacent graphene flakes 302, as depicted in FIG. 3.

The graphene flake coating layer 300 may be formed on the CNT pellicle membrane 102 by applying a suspension comprising an alcohol and the graphene flakes 302 to the CNT pellicle membrane 102. The alcohol may thereafter be evaporated, leaving the graphene flakes 302 on the nanotube pellicle membrane 102. By applying the suspension comprising alcohol the nanotube pellicle membrane 102 may undergo densification while depositing the graphene flake coating layer 300.

The suspension may be applied to the nanotube pellicle membrane 102, by soaking the nanotube pellicle membrane 102 with the suspension. Following this the nanotube pellicle membrane 102 may be rinsed in pure alcohol such as ethanol to remove excessive graphene flakes 302. The alcohol is then evaporated, leaving the graphene flakes 302 on the nanotube pellicle membrane 102. The alcohol may be ethanol however other alcohols may also be used. Alternatively, a solution comprising the graphene flakes 302 and an aqueous or organic media (e.g., N,N-dimethylformamide, dimethyl sulfoxide, N-methyl-2-pyrrolidone) may be used. Moreover, the graphene flakes 302 may also be applied to the CNT pellicle membrane 102 using other techniques such as spray coating, air-brushing or spin-coating.

The CNT pellicle membrane 102 may be heated up to a temperature of 1500° C. during the formation of the graphene flake coating layer 300. In an example embodiment, the CNT pellicle membrane 102 may be heated up to a temperature of 600° C. during the formation of the graphene flake coating layer 300.

A mechanical pressure of 0.1 kPa to 30 MPa may be applied to the CNT pellicle membrane 102 and the graphene flakes 302 when forming the graphene flake coating layer 300. The pressure of 0.1 kPa to 30 MPa is relevant in the case when the CNTs 110 of the CNT pellicle membrane 102 are coated, as disclosed above. Similarly, a pressure of 10-30 GPa is relevant when the CNTs 110 of the CNT pellicle membrane 102 are un-coated as disclosed above.

Figure 4:
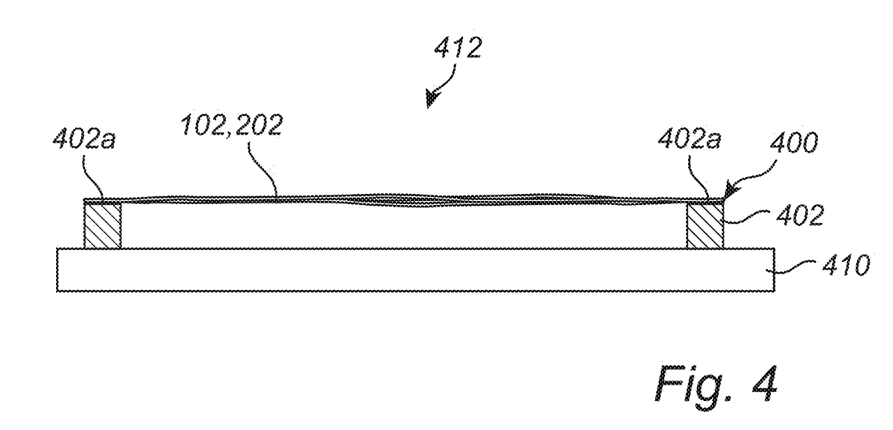
FIG. 4 is a schematic cross sectional view of a pellicle for extreme ultraviolet lithography mounted to a reticle, according to an example embodiment.

Now referring to FIG. 4 here is conceptually depicted how a pellicle 400 for extreme ultraviolet lithography is formed by fixing a CNT pellicle membrane 102, 202 to a pellicle frame 402 and how the so formed pellicle 400 is mounted to a reticle 410 thereby forming a reticle system 412 for extreme ultraviolet lithography.

In the following, it will be described how a CNT pellicle membrane 102, 202 having coated CNTs of the above described kind may be fixed to a pellicle frame 402 with reference to FIG. 4.

A coating is formed on the CNT pellicle membrane 102, 202. The coating may be formed on the CNT pellicle membrane 102, 202 in a manner as described above. The coating may be formed prior to or subsequent to the pressing of the CNT film 104 or films 204a, 204b, also as described above. Alternatively, a separate or additional coating may be formed on the CNT pellicle membrane 102, 202, for the purpose of facilitating attachment to the pellicle frame 402. In either case, a coating may be formed at an entire main surface of the CNT pellicle membrane 102, 202 or only at a peripheral region of the CNT pellicle membrane 102, 202. By peripheral region is intended a region of the CNT pellicle membrane 102, 202 which is to be arranged in abutment with and to be fixed to the pellicle frame 402.

The coated CNT pellicle membrane 102, 202 that is to be fixed to the pellicle frame 402 is arranged on a support surface 402a of the pellicle frame 402. The support surface 402a of the pellicle frame is typically an upper surface of the pellicle frame 402.

For handling purposes, the CNT pellicle membrane 102, 202 may be arranged on a carrier or a temporary substrate (not shown). The CNT pellicle membrane 102, 202 may be transferred to the pellicle frame 402. The main surface of the CNT pellicle membrane 102, 202 facing away from the carrier may be arranged in abutment with the pellicle support surface 402a.

The coating of the CNT pellicle membrane 102, 202 and the pellicle support surface 402a are then bonded together by pressing the CNT pellicle membrane 102, 202 and the pellicle support surface 402a against each other. The CNT pellicle membrane 102, 202 will thereby be fixed to the support surface 402a of the pellicle frame given that a sufficient pressure is used. A pressure of 0.1 kPa to 30 MPa is generally sufficient for bonding together the CNT pellicle membrane 102, 202 and the support surface 402a of the pellicle frame 402, given that the CNTs or CNT bundles 110, 210 of the CNT pellicle membrane 102, 202 are coated as described above. If a carrier is used for handling the CNT pellicle membrane 102, 202, the carrier may be removed from the CNT pellicle membrane 102, 202 prior to or subsequent to the bonding of the CNT pellicle membrane 102, 202 to the pellicle frame 402.

In order to bond together the coated CNT pellicle membrane 102, 202 and the pellicle support surface 402a, the support surface 402a is typically formed by a first material and the coating of the CNTs is typically formed by a second material. Several different material combinations or systems will work for bonding together the CNT pellicle membrane 102, 202 and the pellicle support surface 402a.

The first material may be a metal or a semiconductor, the second material may be a metal or a semiconductor. Typically, the material of the support surface 402a and the material of the coating are different materials. Examples of relevant material combinations or systems which may bonded together are Ru and Ge, Pd and Ge, Ru and Si, and Nb and Si. The above examples may be bonded together by being cold welded, while forming a eutectic. The skilled person realizes that other material combinations may be used to bond together the coated CNT pellicle membrane 102, 202 and the pellicle support surface 402a and that the required pressure may vary for the different materiel combinations being used. For instance, the support surface 402a of the pellicle frame 402 may formed by a first metal and the coating of the CNT pellicle membrane 102, 202 may be formed by a second metal. It may thereby be possible to form a eutectic of the first metal and the second metal during the pressing by selecting a material combination capable of forming a eutectic.

Further, the material of the support surface 402a and the material of the coating may be the same material.

Furthermore, as described above, a low pressure and/or an elevated temperature may facilitate the fixing or cold welding of the CNT pellicle membrane 102, 202 to the support surface 402a of the pellicle frame 402.

The pellicle frame 402 may be formed of the same material as the support surface 402a or may be of a different material. In other words, the pellicle frame 402 may include a frame body onto which the material forming the support surface 402a is applied. The support surface 402a may for instance be formed as a thin metal or semiconductor coating on top of an upper surface of the pellicle frame 402. By this arrangement, the properties of the support surface 402a and the pellicle frame 402 may be tailored independent of each other. For instance, the pellicle frame 402 or frame body may be permeable to air, which reduces the risk of damaging the CNT pellicle membrane 102, 202 when the pellicle 400 is subjected to pressure fluctuations, which for example may occur when transferred into a vacuum environment. The pellicle frame 402 may for instance be formed by Si, SiN, $SiO_2$, or quartz. Other materials for the pellicle frame 202 include metal, plastic or ceramic materials to give a few examples.

The method may further comprise stretching the CNT pellicle membrane 102, 202 in a lateral direction prior to arranging the membrane 102, 202 on the pellicle frame 402. By pre-stretching the CNT pellicle membrane 102, 202, sagging of the membrane 102, 202 may be counteracted. In other words, may exhibit a reduced sagging if stretched in a lateral direction prior to being arranged on the pellicle frame 402. In an example embodiment, a tensile stress of approximately 100 MPa or more may be introduced in the CNT pellicle membrane 102, 202. This may translate to a membrane deflection of less than 0.5 mm for a pellicle of typical dimensions.

Pre-stretching the CNT pellicle membrane 102, 202 may include transferring the CNT pellicle membrane 102, 202 to an intermediate stretchable support. The CNT pellicle membrane 102, 202 may adhere to the stretchable support due to attractive forces at the surface interface between the CNT pellicle membrane 102, 202 and the stretchable support. Any suitable type of stretchable support may be used, such as a stretchable or elastic membrane. The stretchable support may be arranged in a stretching tool adapted to stretch the stretchable support wherein the CNT pellicle membrane 102, 202 may be stretched. The CNT pellicle membrane 102, 202 may subsequently be transferred to the pellicle frame 402. The stretchable support may thereafter be removed from the CNT pellicle membrane 102, 202.

Tensile stress may also be introduced in the CNT pellicle membrane 102, 202 by other means such as by subjecting the CNT pellicle membrane to a thermal treatment process. The thermal treatment process may include heating the CNT pellicle membrane to an elevated temperature (i.e., above room temperature). Additionally or alternatively the thermal treatment process may include cooling the CNT pellicle membrane to a reduced temperature (i.e., below room temperature). Also, applying a coating to the CNT pellicle membrane may increase the tensile stress in CNT pellicle membrane.

Still referring to FIG. 4, here is conceptually depicted how the pellicle 400 is mounted on a reticle 410 to form a reticle system 412, where the reticle system 412 includes the pellicle 400 and the reticle 410. The pellicle 400 may be mounted to the reticle 410 using any suitable means as is known in the art, such as by means of an adhesive. The pellicle frame 402 defines an opening or aperture above the reticle 410. The pellicle membrane 102, 202 covers the aperture. The pellicle membrane 102, 202 is suspended in front of the reticle 410 by the pellicle frame 402. A height or thickness of the pellicle frame 402 may be such that a distance between the main surface of the reticle 410 and the pellicle membrane 102, 202 is in the range of 1 mm to 6 mm.

Figure 5:
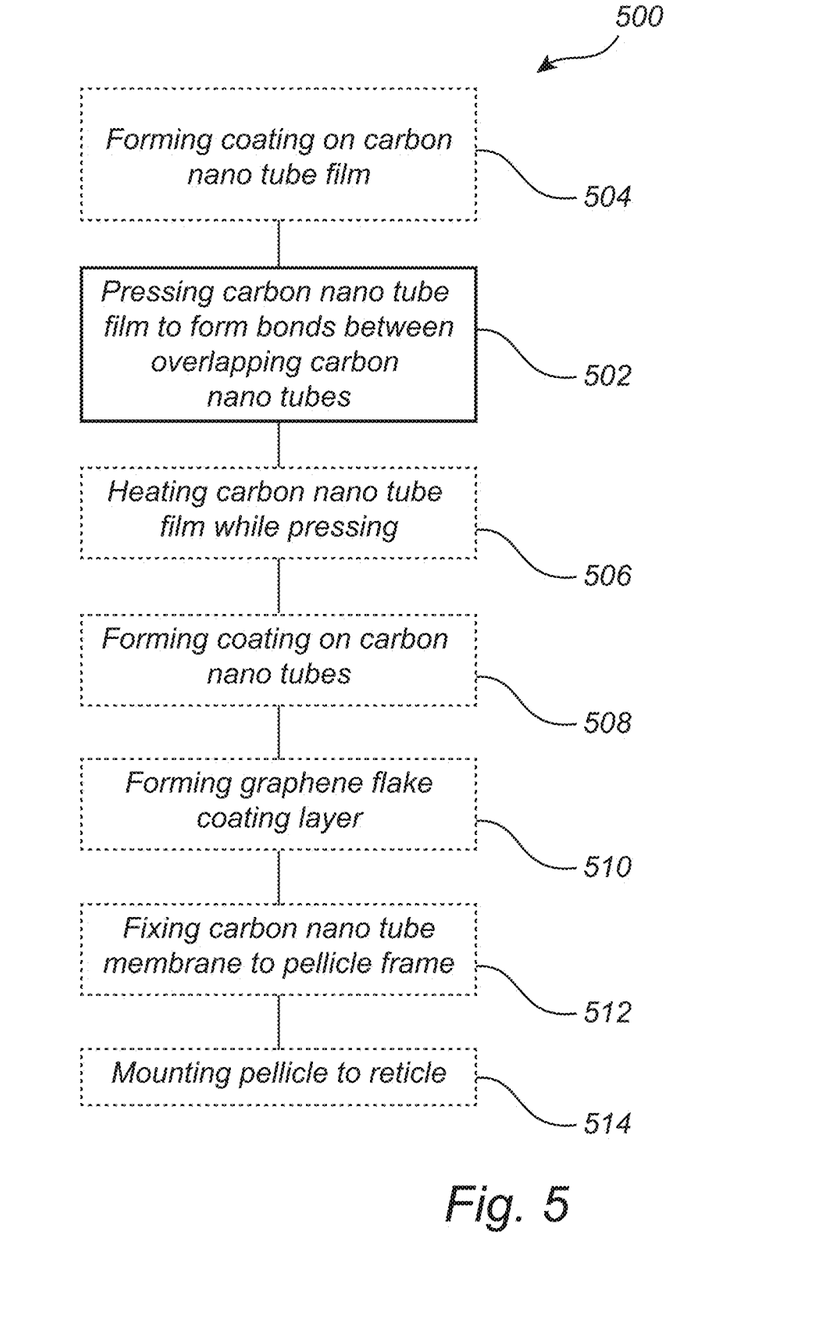
FIG. 5 is a flow chart of a method according to an example embodiment.

Referring now to FIG. 5, a method 500 for forming a CNT pellicle membrane 102, 202 will be generally described.

The method 500 comprises, step 502, bonding together overlapping CNTs 110, 210 of at least one CNT film 104, 204a, 204b by pressing the at least one CNT film 104, 204a, 204b between a first pressing surface 106, 206 and a second pressing surface 108, 208, thereby forming a free-standing CNT pellicle membrane 102, 202.

The method 500 may further comprise, step 504, forming a coating on the at least one CNT film 104, 204a, 204b prior to pressing the at least one CNT film 104, 204a, 204b.

The method 500 may further comprise, step 506, heating the at least one CNT film 104, 204a, 204b while pressing 502.

The method 500 may further comprise, step 508, forming a coating on the CNTs 110, 210 subsequent to pressing 502, wherein forming 508 the coating may include forming a coating including a material selected from the group consisting of: B, $B_4C$, ZrN, Mo, Ru, TiN, SiC, a-C, and graphene.

The method 500 may further comprise, step 510, forming a graphene flake coating layer 300 by depositing graphene flakes 302 on a main surface of the CNT pellicle membrane 102, 202. It should be noted that if both steps 508 and 510 are to be performed, step 510 may be performed prior to step 508. The coating formed in step 508 may accordingly be formed to cover the graphene flake coating layer.

The method 500 may further comprise, fixing, step 512, a CNT pellicle membrane 102, 202 to a pellicle frame 402 for forming a pellicle 400.

The method 500 may further comprise, mounting, step 514, the pellicle 400 to a reticle 410 for forming a reticle system 412.

In the above the disclosure has mainly been described with reference to a limited number of embodiments. However, as is readily appreciated by a person skilled in the art, other embodiments than the ones disclosed above are equally possible within the scope of the disclosure, as defined by the appended claims.

Additionally, variations to the disclosed embodiments can be understood and effected by the skilled person in practicing the claimed disclosure, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A method for forming a carbon nanotube pellicle membrane for an extreme ultraviolet lithography reticle, the method comprising:
    bonding together overlapping carbon nanotubes of at least one carbon nanotube film by pressing the at least one carbon nanotube film between a first pressing surface and a second pressing surface, thereby forming a carbon nanotube pellicle membrane,
    wherein at least one of the first pressing surface or the second pressing surface is provided with a protruding pattern, and
    wherein the protruding pattern has a pitch smaller than an average length of the overlapping carbon nanotubes of the at least one carbon nanotube film or bundles of carbon nanotubes of the at least one carbon nanotube film.

2. The method according to claim 1, wherein at least two separate carbon nanotube films are pressed between the first pressing surface and the second pressing surface.

3. The method according to claim 1, further comprising, forming a coating on the at least one carbon nanotube film prior to pressing the at least one carbon nanotube film.

4. The method according to claim 3, wherein forming the coating includes forming a coating including at least one material selected from the group consisting of: B, B4C, ZrN, Mo, Ru, SiC, TiN, and a-C.

5. The method according to claim 3, wherein the pressing the at least one carbon nanotube film includes applying a pressure of 0.1 kPa to 30 MPa.

6. The method according to claim 1, wherein the overlapping carbon nanotubes of the at least one carbon nanotube film are in direct contact at locations where the overlapping carbon nanotubes overlap.

7. The method according to claim 1, wherein the protruding pattern is formed by a rough surface, a set of protruding pins, a line pattern, a square grid, or a hexagonal grid.

8. The method according to claim 1, wherein the pitch of the protruding pattern is between 200 nm and 200 µm.

9. The method according to claim 1, further comprising heating the at least one carbon nanotube film while pressing the at least one carbon nanotube film.

10. The method according to claim 1, the method further comprising:
    forming a graphene flake coating layer by depositing graphene flakes on a main surface of the carbon nanotube pellicle membrane.

11. The method according to claim 10, wherein a lateral dimension of the graphene flakes along a main surface of the graphene flakes is between 75 nm and 50 µm.

12. The method according to claim 10, wherein the forming of the graphene flake coating layer further comprises heating the carbon nanotube pellicle membrane.

13. The method according to claim 10, wherein the forming of the graphene flake coating layer further comprises applying a pressure to the carbon nanotube pellicle membrane and the graphene flakes.

14. A method for forming a pellicle for extreme ultraviolet lithography, the method comprising:
    forming the carbon nanotube pellicle membrane according to the method of claim 1, and fixing the carbon nanotube pellicle membrane to a pellicle frame.

15. The method according to claim 14, wherein a coating is formed on the carbon nanotube pellicle membrane and wherein the step of fixing comprises:
   arranging the carbon nanotube pellicle membrane on a support surface of the pellicle frame, and
   bonding together the coating of the carbon nanotube pellicle membrane and the support surface of the pellicle frame by pressing the carbon nanotube pellicle membrane and the support surface of the pellicle frame against each other thereby fixing the carbon nanotube pellicle membrane to the support surface of the pellicle frame.

16. The method according to claim 15, wherein the support surface of the pellicle frame is formed by a first material and the coating is formed by a second material,
   the first material being a metal or a semiconductor,
   the second material being a metal or a semiconductor.

17. The method according to claim 15, further comprising heating the carbon nanotube pellicle membrane and the pellicle frame while pressing the carbon nanotube pellicle membrane and the support surface of the pellicle frame against each other.

18. The method according to claim 15, wherein the bonding comprises pressing the carbon nanotube pellicle membrane and the support surface of the pellicle frame together using a mechanical pressure while applying a vacuum to the carbon nanotube pellicle membrane and the pellicle frame.

19. A method for forming a reticle system for extreme ultraviolet lithography, the method comprising:
   forming the pellicle according to the method of claim 14, and
   mounting the pellicle on a reticle.

20. A carbon nanotube pellicle membrane for an extreme ultraviolet lithography reticle, formed according to the method of claim 1.

* * * * *